United States Patent
Azar

(10) Patent No.: US 6,301,779 B1
(45) Date of Patent: *Oct. 16, 2001

(54) METHOD FOR FABRICATING A HEAT SINK HAVING NESTED EXTENDED SURFACES

(75) Inventor: Kaveh Azar, Westwood, MA (US)

(73) Assignee: Advanced Thermal Solutions, Inc., Norwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,599

(22) Filed: Oct. 29, 1998

(51) Int. Cl.$^7$ .................................................. B23P 15/26
(52) U.S. Cl. ...................................... 29/890.03; 165/80.3
(58) Field of Search ........................... 29/890.03, 890, 29/428, 464; 165/80.3

(56) References Cited

U.S. PATENT DOCUMENTS

| | | |
|---|---|---|
| 3,217,793 | 11/1965 | Coe . |
| 3,313,340 | 4/1967 | Dubin . |

(List continued on next page.)

FOREIGN PATENT DOCUMENTS

| | | | |
|---|---|---|---|
| 485205 | 5/1992 | (EP) . | |
| 612105 | 8/1994 | (EP) . | |
| 623952 | 11/1994 | (EP) . | |
| 698214 | 10/1953 | (GB) . | |
| 60190048 | 12/1985 | (JP) . | |
| 1204498 | 8/1989 | (JP) | 361/702 |
| 2047895 | 2/1990 | (JP) . | |
| 4267547 | 9/1992 | (JP) | 257/722 |
| 4291750 | 10/1992 | (JP) | 257/722 |

OTHER PUBLICATIONS

Author Unknown, "Non–Uniform Fin Shapes of Modules in Air–Cooled Environments", IBM Technical Disclosure Bulletin, vol. 28, No. 6, Nov. 1985.

Horvath et al., "Metal Cooling Fins for a Semiconductor Package", IBM Technical Disclosure Bulletin, vol. 26, No. 7A, Dec. 1983, pp. 3233–3234.

*Primary Examiner*—I. Cuda Rosenbaum
(74) *Attorney, Agent, or Firm*—Lieberman & Brandsdorfer, LLC

(57) ABSTRACT

A plurality of substantially similar fins is produced from the thermally conductive and formable sheet stock, for example aluminum or copper, preferably using a set of matched forming dies. Each die in the set produces a fin that is cupped in side elevation. Each fin has two flanges (in the preferred embodiment) extending from the base portion of the cup, and the fin is preferably rectangular in plan. The die cavities are substantially identical in geometry, but differ slightly in dimension so that the base portion of the cup-shaped fin-pair produced by each die in a set varies in width. Each die in the set includes a feature for producing a locating lug or dimple, or alternatively a hole, in each fin produced. The plurality of substantially geometrically identical, but dimensionally differing fin-pairs are then assembled in a nested stack in accordance with the invention. Each fin-pair in the stack is substantially identical in geometry but the base portion of each fin is successively smaller in dimension, moving axially from top to bottom of the fin stack, to allow for the nesting and so that edges of successive fins define gaps of predetermined dimension. The dimple allows for registration and fine alignment and as the nested dimple substantially align themselves as each fin is assembled in the stack. An interference fit between the dimples may be used to secure the assembled stack. Conventional fabrication techniques are optionally used, including bonding, welding, and brazing, to secure the nested fins to each other. Alternatively, a through hole may be used to effectuate both location of the nested fins and provide for mechanical fastening.

15 Claims, 16 Drawing Sheets

U.S. PATENT DOCUMENTS

| | | |
|---|---|---|
| 3,457,988 | 7/1969 | Meyerhoff et al. . |
| 3,706,127 * | 12/1972 | Oktay et al. .................. 29/890.03 |
| 4,296,455 | 10/1981 | Leaycraft et al. .................. 361/691 |
| 4,535,384 | 8/1985 | Wakabayashi et al. ............. 165/80.3 |
| 4,765,397 | 8/1988 | Chrysler et al. ................ 165/104.33 |
| 4,953,634 | 9/1990 | Nelson et al. ........................ 165/147 |
| 5,020,586 | 6/1991 | Mansingh ............................ 165/80.3 |
| 5,040,596 | 8/1991 | Terasaki et al. ..................... 165/166 |
| 5,077,601 | 12/1991 | Hatada et al. ......................... 357/81 |
| 5,168,348 | 12/1992 | Chu et al. ............................ 257/713 |
| 5,241,452 | 8/1993 | Kitajo ................................... 361/718 |
| 5,304,845 | 4/1994 | Lindquist et al. ................... 257/722 |
| 5,304,846 | 4/1994 | Azar et al. ........................... 257/722 |
| 5,381,859 | 1/1995 | Minakami et al. .................. 165/80.3 |
| 5,419,041 * | 5/1995 | Ozeki ................................ 29/890.03 |
| 5,437,328 | 8/1995 | Simons ................................ 165/146 |
| 5,486,980 | 1/1996 | Jordan et al. ....................... 361/697 |
| 5,542,176 | 8/1996 | Serizawa et al. ................. 29/890.03 |
| 5,558,155 * | 9/1996 | Ito ..................................... 29/890.03 |
| 5,566,749 | 10/1996 | Jordan et al. ....................... 165/80.3 |
| 5,609,201 | 3/1997 | Anderson et al. ................... 165/80.3 |
| 5,653,285 | 8/1997 | Lee ....................................... 165/185 |
| 5,709,263 | 1/1998 | Mira ..................................... 165/80.3 |
| 5,758,418 * | 6/1998 | Chrysler et al. .................. 29/890.03 |
| 5,763,950 | 6/1998 | Fujisaki et al. ..................... 165/80.3 |
| 5,937,517 * | 8/1999 | Smith et al. ...................... 29/890.03 |

\* cited by examiner

METHOD FOR FABRICATING A HEAT SINK HAVING NESTED EXTENDED SURFACES

TECHNICAL FIELD

This invention relates generally to manufacturing of heat-dissipating devices, and more specifically to a method for fabricating a heat sink having a plurality of nested extended surfaces.

BACKGROUND OF THE INVENTION

Effective extraction of heat produced by electrical devices is important in order to extend the useful life of these devices. Conventional heat sink devices typically utilize an array of extended surfaces, such as fins, integrally formed on a common base and projecting into the ambient fluid surrounding the device. The base is placed in thermally intimate contact with a heat-producing device to provide a conduction path to the fin array. Fluid circulation, through forced or natural convection, around the fin array acts as the heat transfer medium to cool the device to a satisfactory operating temperature.

It is well recognized that various design parameters including fin geometry (such as the number of fins, fin spacing, length and width), material selection, device characteristics, and ambient conditions, among others, influence the heat dissipation performance of the heat sink. In some applications, a plurality of fins arranged with predetermined dimensions, or channel width between adjacent fins gives optimum heat sink performance. Such narrow channel heat sinks are described in a pending United States Patent Application by Azar.

Unfortunately, conventional heat sinks are often expensive and difficult to fabricate, particularly in those cases where high heat dissipation performance is required and a plurality of long fins in a close packed array is used in the heat sink design. Known heat sink manufacturing techniques including casting and machining are often ill-suited to produce such high performance heat sinks in a cost effective manner. More specifically, difficulties are common in completely filling the deep cavities necessitated by long fin designs during the casting process. Moreover, the draft angle imposed on the fin geometry to produce acceptable cast parts is often incompatible with narrow channel heat sink designs. Machining, likewise, has limitations in regard to both producing long fin lengths and narrow channel spacing. Lengthy production times, and inefficient material usage also lead to high costs of parts for many machined heat sink designs. More importantly, conventional casting and machining techniques are sometimes incapable of producing the desired heat sink design at any cost.

Fabricated heat sinks may be advantageously employed in applications where other manufacturing techniques are impractical or too costly. Fabricated heat sinks are non-unitary designs in that the base and fin array are manufactured as separate parts, and are then joined to produce the final heat sinks device, using for example, brazing, welding, friction welding, bonding, soldering, and other known techniques. Fabricated heat sinks may be designed to have substantially identical thermal performance as unitary heat sink devices as a result of improvements in both material and fabrication techniques. Any inherent resistance to thermal conduction at the interface between fin field and base of the fabricated heat sink may be both minimized and offset by careful selection of other design parameters. However, while satisfactory in many heat sink applications, including high-performance applications, conventional fabricated heat sinks can be time-consuming to produce as each individual fin needs to be assembled to the base while maintaining often exacting channel spacing.

What is desirable then is a method for fabricating a low-cost heat sink that is suited to a variety of heat-dissipation applications, including high-performance and narrow-channel applications, but is not restricted to a narrow selection of design parameters as is the case with heat sinks produced by conventional manufacturing techniques.

SUMMARY OF THE INVENTION

A novel method for fabricating a heat dissipating device using a stack of nested extended fins is disclosed. In the preferred embodiment of the invention, a plurality of substantially similar fins are produced from thermally conductive and formable sheet stock, for example aluminum or copper, preferably using a set of matched forming dies. Each die in the set produces a fin or fin-pair. In the case of a die producing a fin-pair, the fin-pair appearance is cupped in side elevation in that each fin-pair has at least one flange extending from the base portion of the cup, and the fin-pair is rectangular in plan. The die cavities are substantially identical in geometry, but differ slightly in dimension so that the base portion of the cup-shaped fin-pair produced by each die in the set vary in width. Each die in the set includes a feature for producing a locating lug or dimple, or alternatively a hole, in each fin-pair produced. Features are optionally located within the die to create surface enhancements to the fin-pairs such as vents, vanes, or surface textures which are advantageously utilized in certain heat sink applications. Such surface enhancements, alone, or in various combinations may improve heat sink performance. Such features may be difficult or impossible to produce using traditional manufacturing methods, but may be readily incorporated into a given heat sink design using the method of the present invention.

In a preferred embodiment, the plurality of substantially geometrically-similar, but dimensionally differing fin-pairs are then assembled in a nested stack, in accordance with the invention. Each fin-pair in the stack is substantially identical in geometry but the base portion of each fin is successively smaller in dimension (moving axially from top to bottom of the fin stack) to allow for the nesting and so that edges of successive fins define gaps of predetermined dimension. The dimple allows for registration and fine-alignment and as the nested dimples substantially align themselves as each fin is assembled in the stack. An interference fit between the dimples may be used to secure the assembled stack. Conventional fabrication techniques are optionally used, including bonding, welding, compression, soldering and brazing, to secure the nested fins to each other. Alternatively a through hole may be used to effectuate both location of the nested fins and provide for mechanical fastening.

In a further embodiment of the invention, a plurality of geometrically similar or dissimilar fins are combined to form a heat dissipating device. The individual fins may comprise a plurality of shapes and sizes, and may be stacked in a single fin assembly. As such, each fin may comprise a dimple as a guiding pin for assembly wherein an edge of the fin is adapted for being individually stacked and secured onto the base. Successive individual fins may be smaller, identical or larger depending upon the desired result. Accordingly, this further embodiment provides a novel method to custom design a heat dissipating device to fit a desired need.

DETAILED DESCRIPTION OF THE PREFERRED EMBODIMENT AND BEST MODE

Figure 1:
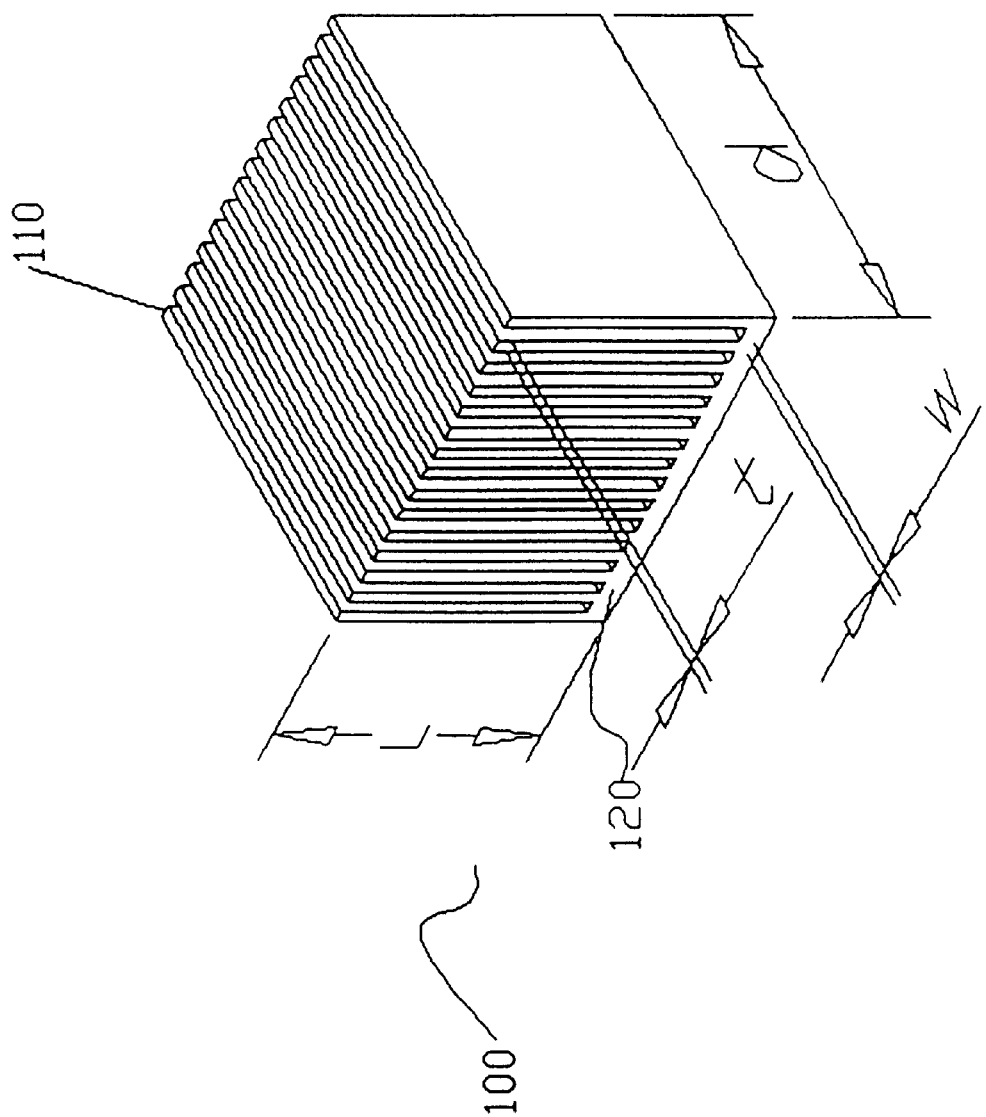
FIG. 1 is a pictorial representation of a conventional cast or machined unitary heat sink.

FIG. 1 is a pictorial representation of a conventional cast extrusion or machined unitary heat sink 100. As shown, a plurality of extended fins 110 project from base 120. Typically, the lower surface of base 120 is placed in thermally intimate contact with a heat-producing device (not shown). In such unitary heat sinks, a block of metal (often aluminum) or other material having a high coefficient of thermal conductivity is processed, typically via milling, grinding, or extrusion until enough material is removed to reveal the desired finished heat sink geometry. Fins 110 are defined by length l, thickness t, depth d, and interfin spacing w, also known as channel width. The number of fins n and dimensions l, t, d and w, along with material parameters such as the coefficient of thermal conductivity are selected to meet requirements of a specific heat sink application. Those skilled in the art will recognize that some applications may require that, in particular, design parameters be specified such that typical manufacturing techniques are impractical. For example, as discussed above, long and thin fins can raise difficulties with "short shots" where mold cavities are not completely filled during casting. Such fin geometries may also lend themselves to the draft angle necessary to facilitate removal of the cast heat sink from the mold. Narrow channel designs can create problems insofar as the material in the mold used to form the channels is so thin that it may be marginal or insufficient with regard to mechanical strength and the ability to transfer heat away from the cast part during cooling. High mold wear and production cycle times can result with a concomitant increase in part cost.

Limitations also exist in the range of heat sink designs that can be economically produced by traditional techniques. For example, a heat sink design having large values of n, d and l means a significant amount of material needs to be machined away, increasing part cost through high production time and poor material utilization. Additional surface features for the fins are difficult, or impossible, to produce using machining processes, particularly for interior fins having low values of w.

Figure 2:
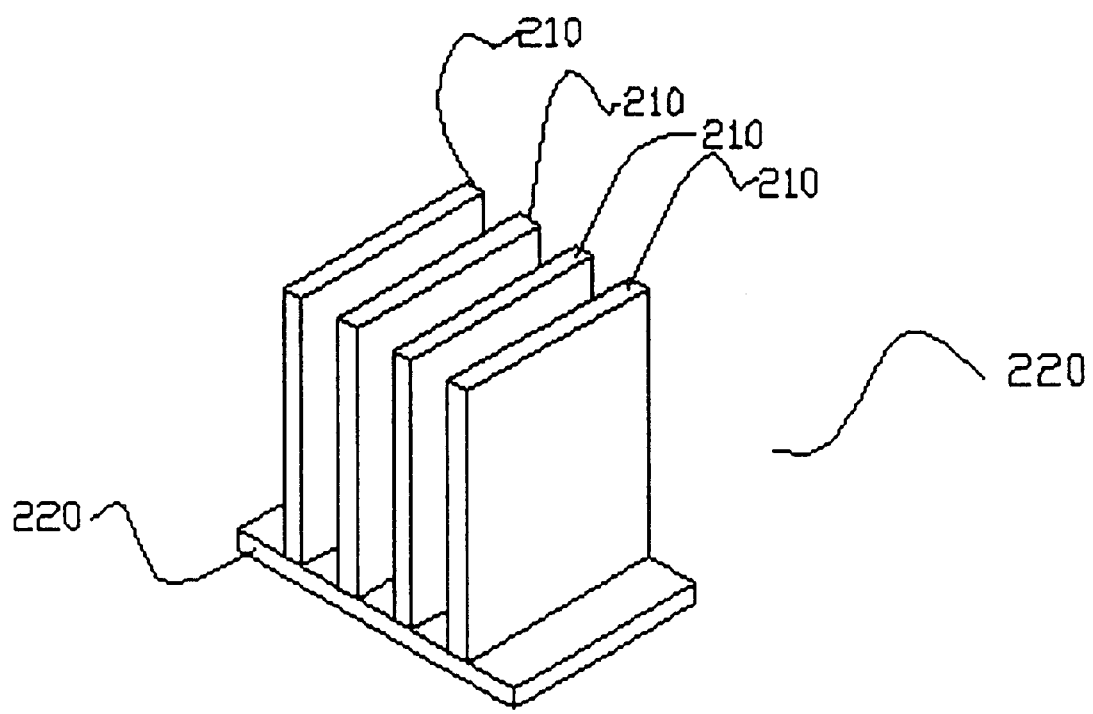
FIG. 2 is a pictorial representation of a conventional fabricated heat sink showing a base and a fin field, where individual fins are attached to the base using, for example, soldering, welding, brazing, gluing, pressing and heating, and combinations thereof.

FIG. 2 is a pictorial representation of a fabricated heat sink 200 where fins 210 are separately manufactured from base 220 and then attached to base 220 in a secondary operation. Such attachment is typically realized through brazing, soldering, welding (including friction welding), and the like. Alternatively, bonding or mechanical fastening is employed. The use of fabrication techniques can yield production economies over machined heat sinks as material utilization in the heat sink may be significantly improved. However, heat sink designs using large values of n and small values of t can still be both difficult and time-consuming to produce. In addition, thin fins are not well suited to many attachment techniques due to the restricted cross-sectional area of the fins. The use of thin fins also requires particularly exacting bonds or welds in order to minimize the resistance of thermal conduction at the junctions between fin 210 and the base 220, and to ensure good mechanical strength. Such resistance lessens the ability of the fin field to dissipate the heat flowing from the heat producing device through base 220.

The heat sink fabrication method of the invention does not suffer the drawbacks of casting, machining, or fabrication noted above. The inventive method may be used to produce a wide variety of heat sink designs, including high performance narrow channel (i.e. low values of w), without particular regard to the number or length of fins. Moreover, surface enhancements may be readily incorporated in any or all of the fins used in a given heat sink design.

Furthermore, although the attached figures illustrate the base of the formed heat exchanger as being a horizontal surface, the base may be formed in a variety of shapes and positions. For example, a heat exchanger base may be circular in shape, thereby allowing the formed heat exchanger to be fitted around a circular object or fixture. Again, the non-planar shape of a heat exchanger should not be considered to be limited to a circular shape, rather the non-planar shape of a heat exchanger may be manufactured in a variety of shapes and sizes according to the desired result. Accordingly, both planar and non-planar heat exchangers may be formed in conjunction with the method of manufacturing described herein.

Figure 3:
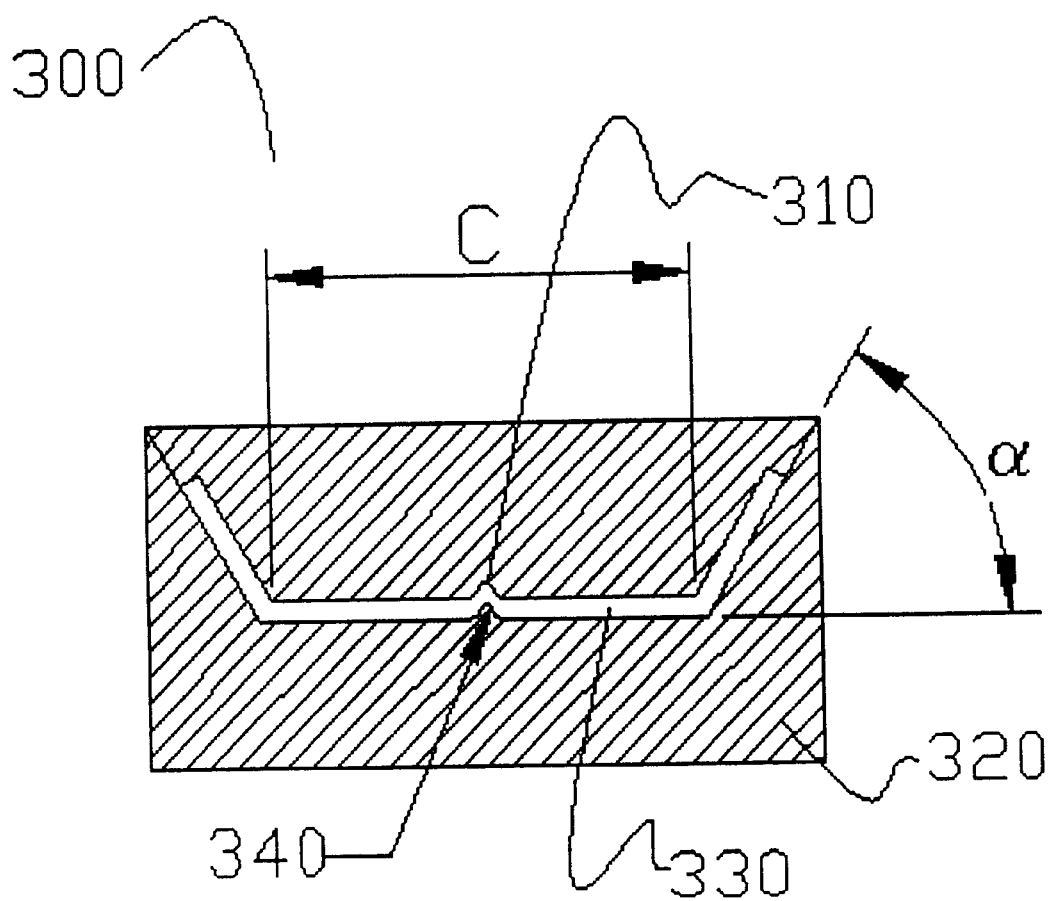
FIG. 3 is a sectional view, the plane of which is perpendicular to the longitudinal axis, of one of a series of dies used to produce a plurality of fins in accordance with the invention.

FIG. 3 is a sectional view, the plane of which is perpendicular to the longitudinal axis, of an exemplary matched die 300 for illustration of the principles of the present invention. Die 300 includes an upper portion 310 and a lower portion 320. The cavity of die 300 is included between the upper and lower portions, as show, and is cup shaped in elevation. That is, cavity 330 having a characteristic base width c is adapted to produce a formed metal fin having a substantially flat base with two flanges that extend upward and outward at a steep angle a with respect to the base. The mating surfaces of the upper and lower portions of the die 310 and 320 respectively, may be optionally configured to shear excess material from the fin surfaces during the forming operation. Die 300 is configured to be substantially rectangular so as to produce a fin in the form of an elongated channel. Those skilled in the art will appreciate that the specific geometry of die 300 and that of the formed metal fin will differ slightly according to a variety of factors, including material, design, and manufacturing parameters. To name just a few examples, the modulus of elasticity of the material specified will affect the "spring-back" of the fin. The thickness t of the formed fin, angle a, may affect the amount of bending required to achieve sufficient plastic deformation to hold a desired shape. And, the forming rate, die surface texture, and extent to which lubrication is used during forming should be considered when designing die 300 to produce a particular fin configuration.

Within cavity 330 is a deflecting feature 340 extending upwards from lower die portion 320 with a corresponding recess in upper die portion 310. In this example of the invention, a semi-spherical shape for deflecting feature 340 produces a corresponding dimple in the base of the formed metal fin. As used here, the term "dimple" is defined to include a "protrusion" on the side of the metal fin opposite the deflecting feature 340, and a "recess" in the same side. However, several types of deflected lug shapes are envisioned as being appropriate depending on the requirements of a particular application (for example a longitudinal rib). Alternatively, feature 340 may be adapted to produce a through hole in the fin during the forming operation. Additional deflecting or cutting features (not shown) may be optionally located within die 300 to produce certain surface enhancements in the formed fin, including vents, vanes, or particular surface textures for allowing ducted fluid flow. The function of such surface enhancement is equivalent to a plumbing structure for delivering coolant to the heat dissipating device. Such features may be useful to enhance heat dissipation performance, alone or in various combinations, for example, by determine the formation of high fluid pressure within the fin field, reducing premature egress of fluid pressure at the top of the fin field, or by minimizing boundary layer formation. The features and characteristics of dies that are necessary to produce vents, vanes, or surface textures are known in the metal-forming art. Alternatively, a multi-step process may be used whereby the surface enhancements are introduced to the metal stock either prior to, or after, the fin forming step using die 300.

Figure 4:
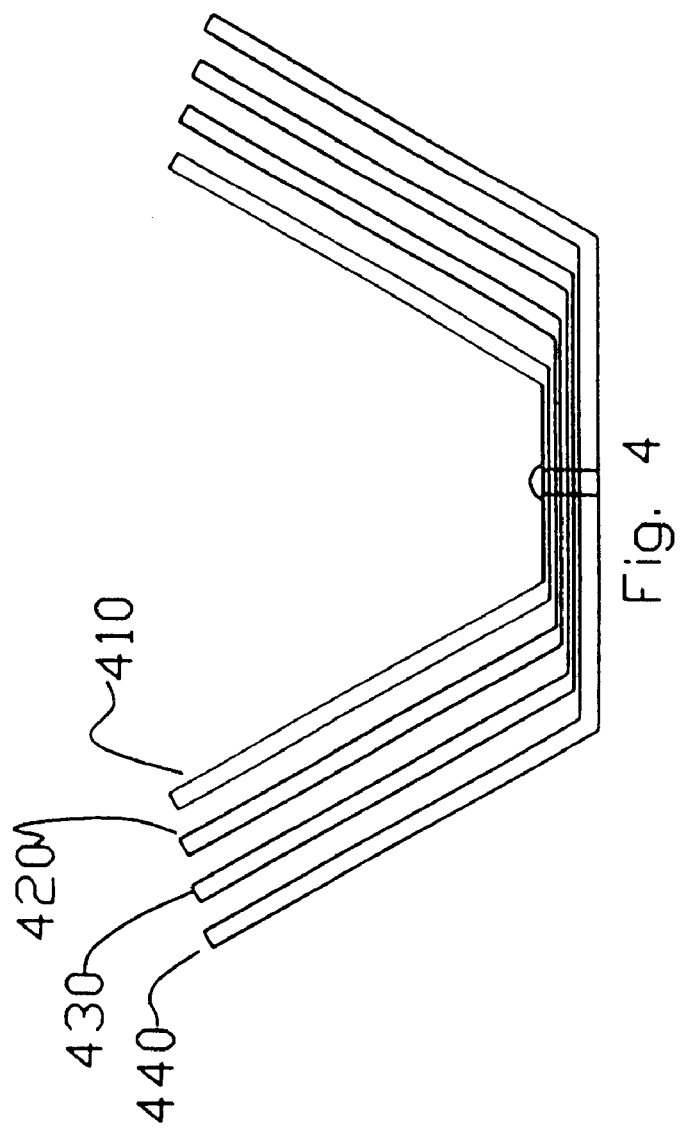
FIG. 4 is a side view of the preferred embodiment of a heat sink manufactured in accordance with the invention.

It should be noted that die 300 is intended to be one of a series of dies that are used to manufacture a heat sink in accordance with the principles of the invention. More specifically, the series may include a number of dies which corresponds to the number of fin-pairs used in a specific heat sink design in the event a fin having a configuration of a base with two flanges that extend upward at both ends is desirable. As illustrated in FIGS. 3 and 4, each die in this configuration of the series is substantially identical in geometry, but differ in characteristic base width c of cavity 330. In this illustrative example of the invention for a heat sink design having eight fins, n=8, and constant channel width w, four dies are employed. Given that the first die has a characteristic base width c, the remaining three dies have a characteristic base width c-2w, c-3w, and c-4w, respectively. As is discussed in greater detail below, the variable base width allows the fins formed by the dies to nest together with flanges that are substantially parallel and separated by a distance w.

Figure 14:
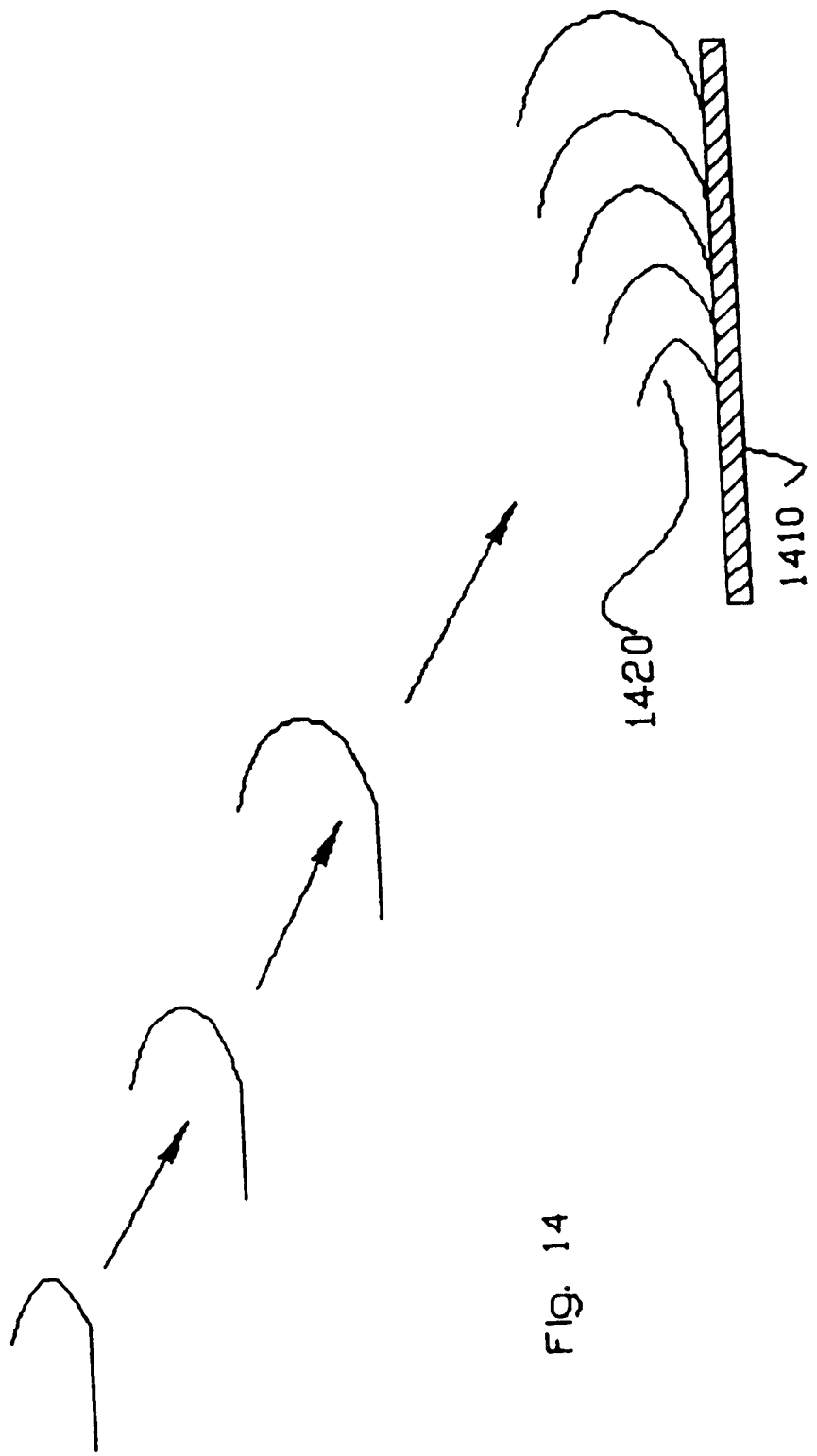
FIGS. 14 and 15 illustrate a side view of a further embodiment of a heat dissipating device manufactured in accordance with the invention.
Figure 15:
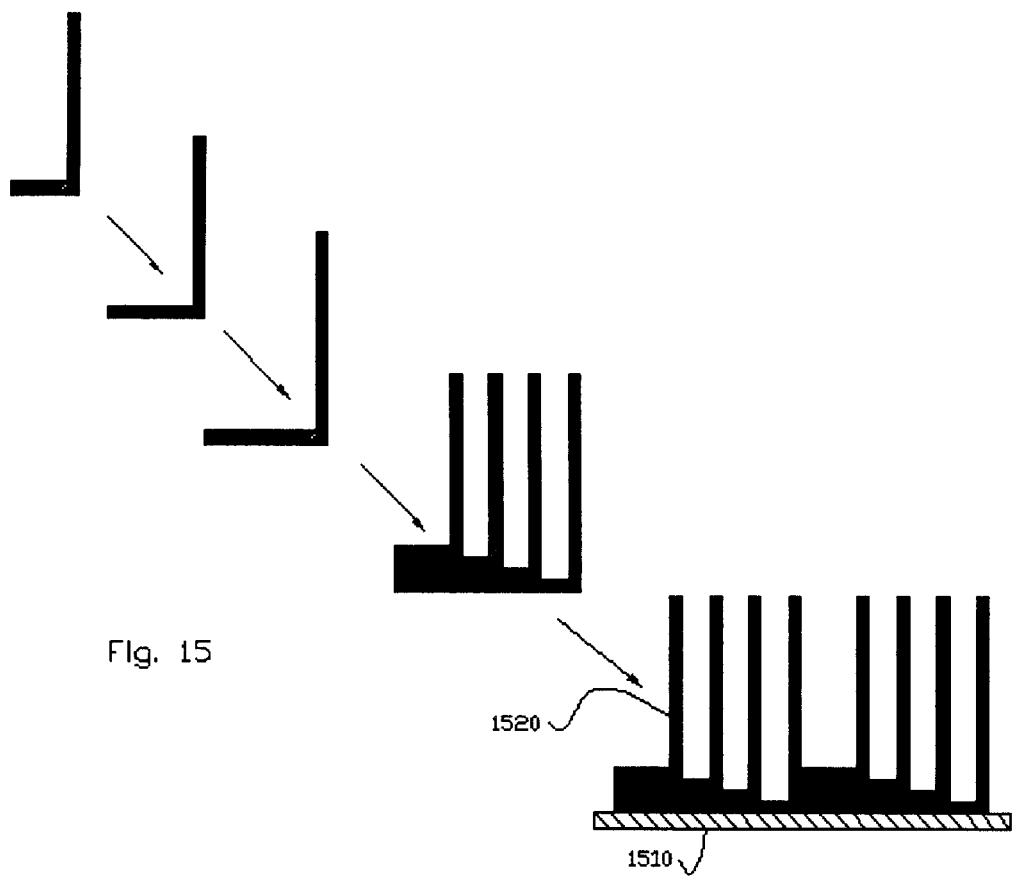

In a further embodiment, the desired fabricated heat dissipating device incorporating the use of die 300 may result in a structure as illustrated in FIGS. 14 and 15 by means of a single fin assembly method. In this embodiment of the invention, successive individual fins are formed and stacked onto a base 1410 and 1510, respectively. As illustrated in FIGS. 14 and 15 respectively, the final fin assembly may comprise straight edge fins 1520 or elliptical shaped fins 1420, or may even comprise dissimilar fin shapes (not shown). The fins may also be assembled onto a base in a "bunched" configuration as illustrated in FIG. 15, or the fins may be assembled onto a base in a "straight" configuration as illustrated in FIG. 14. FIG. 15 is an illustrative example of a single fin assembly in a "bunched" configuration, wherein each fin produced is "L" shaped having two sets, with each successive fin being stacked on the previous set, and each set being mounted onto the base 1510. Another illustrative example of a single fin assembly is shown in FIG. 14, where each individual fin is elliptically shaped, having each successive fin being dimensionally smaller than the previous fin, and each fin is stacked on the straight portion of the previous fin which is secured to the base 1410. The nested fins essentially slide into each other to form the fin assembly of the heat exchanger. Regardless of the specific geometric shape of the individual fins, the multiple fins in the single fin assembly are secured together by the deflecting features disclosed in the fin-pair assembly method. Similarly, the single fin assembly is secured to the base with an equivalent method as the disclosed in relation to the fin-pair assembly. Accordingly, the single fin assembly method and configuration provides for incorporation of die 300 for forming the fin together with the deflecting feature 340 and the corresponding recess 310 while eliminating the necessity for the parallel formation of nested fins having two flanges extending outward from the base and being secured at or near midsection of the formed sheet.

Regardless of the single fin assembly or multiple fin assembly, the process of forming the individual or multiple fins is similar. Metal stock is fed into die 300 mounted in a conventional press, which in operation, produces a formed fin. Both metal sheet and plate may be appropriate for this forming step, depending on particular requirements of the desired heat sink. For example, aluminum and copper alloys are preferred materials having good thermal conductivity and ductility. In some applications of the invention, the forming and sizing operations are simultaneously performed, in others, secondary sizing or trimming operations may be used, particularly when a specific edge finish is desired.

Figure 5:
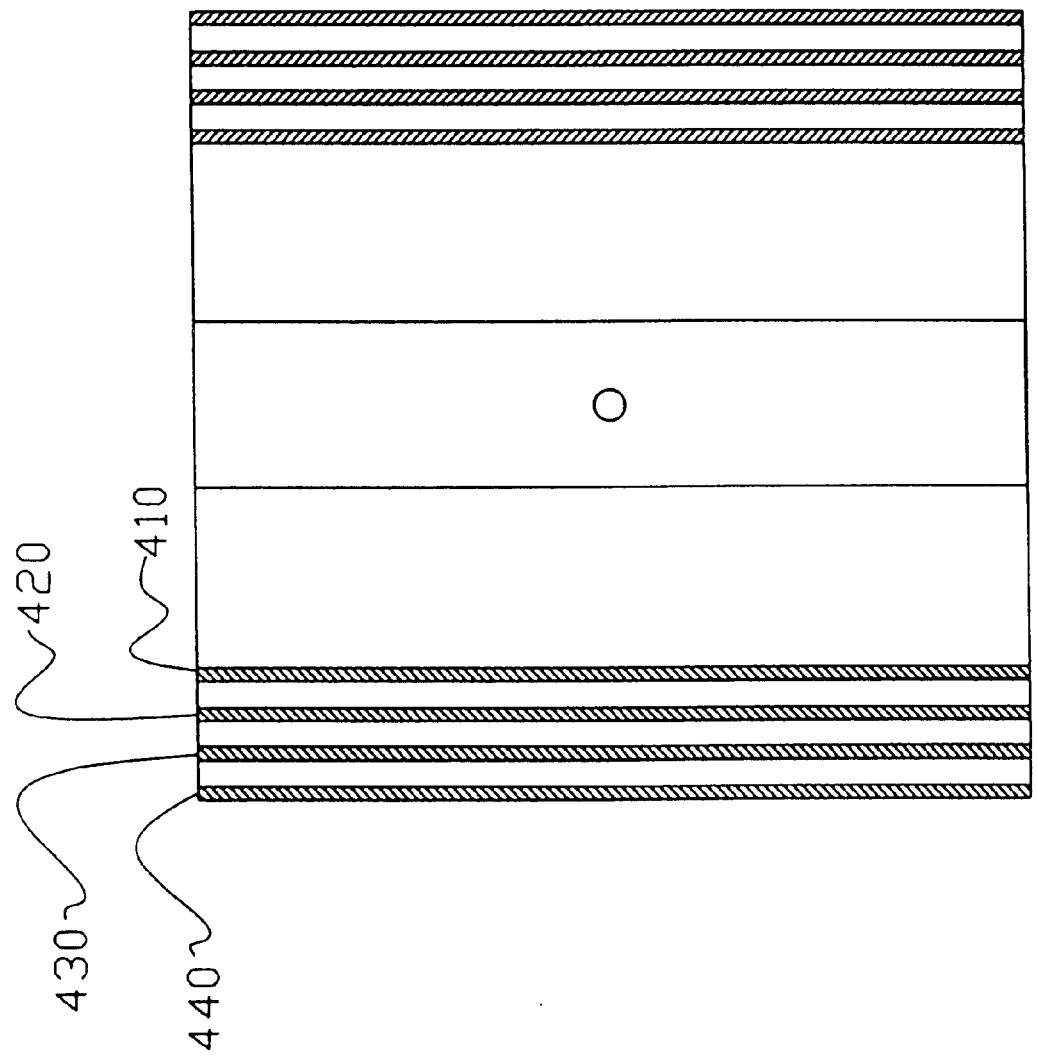
FIG. 5 is a plan view of the heat sink of FIG. 4 in accordance with the invention showing the length L of the heat sink.

FIG. 4 is a side view of an illustrative heat sink 400 manufactured in accordance with the preferred embodiment of the invention. FIG. 5 is a plan view of the heat sink of FIG. 4. The heat sink of both FIGS. 4 and 5 is produced by assembling formed fin-pairs produced by operation of die 300 as discussed above, and more particularly by the series of four dies which produces four formed fin-pairs. The four formed fin-pairs are designated by reference numerals 410 to 440, inclusive, and in accordance with the principles of the invention, are assembled into a nested stack. Each formed fin-pair has a base 450, and two extended flanges 460 that substantially correspond to the geometry of cavity 330 of die 300 in FIG. 3.

Figure 6:
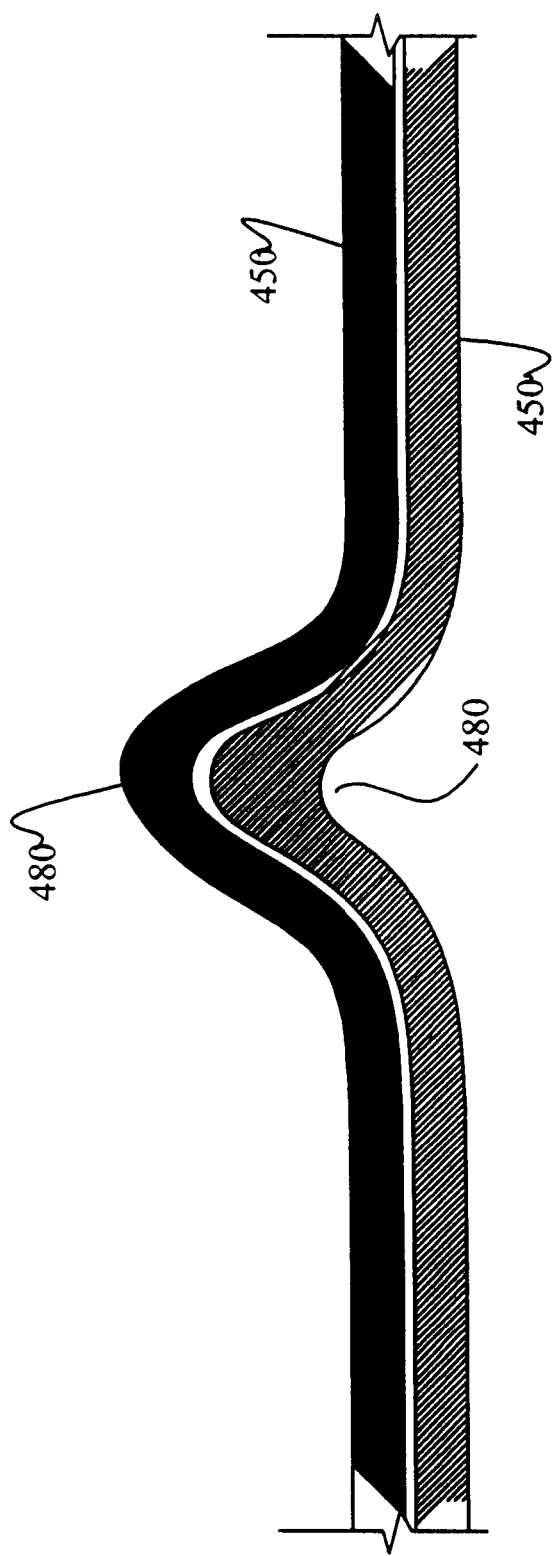
FIG. 6 is an enlarged cross section of the heat sink of FIG. 4 in accordance with the invention showing the interlocked dimples feature.

As shown more specifically in FIG. 6, the dimples 480 produced by die 300 in the base portion 450 of each single fin or fin-pair maintains a spatial relationship to provide the desired channel spacing w between adjacent fin-pairs 410–440 in the nested stack. That is, formed fin-pairs 410–440 are arranged coaxially about axis X—X in FIG. 4 with the dimples inter-engaging or interlocking so that a nested fin stack is created with the desired channel spacing w between the fin-pairs 410–440 and with the fin-pairs held against shifts either longitudinally or transversely. Similarly, the fins produced in the single fin assembly are arranged with the dimples inter-engaging or interlocking so as to form a nested stack with the desired channel spacing w between successive fins, and with the single fins being held against longitudinal or transverse movements. While in this embodiment of the invention four fin-pairs are used to produce a fin field of eight fins, it is emphasized that it is possible to produce a fin field with a fewer or greater number of fins, by assembling the required number of fin-pairs into the nested stack.

Once assembled, the nested stack of individual fin or fin-pairs is fastened together to produce the completed heat sink using techniques including brazing, welding (including welding techniques such as friction or compression welding where no additional fill material is used during the welding process), soldering, gluing, pressing, heating or bonding. For example, the nested stack may be passed through a wave solder bath for securing the base portion of the adjacent fins, thereby forming a solid and rigid base for the heat dissipating device. Alternatively, mechanical fastening means may be employed using the through holes described above or simply the nested edges of the base portion of the fin or fin-pair, using for example a clamp. An example of a mechanical fastening process includes applying a cold compression to the nested fin stack for forming the base portion of the heat dissipating device from the horizontal portions of the individual fins of the nested stack. Another example of a mechanical fastening process includes applying an arc-welding to the nested stack for forming the base portion of the heat dissipating device from the horizontal portions of the individual fins of the nested stack. Depending on the fastening technique chosen, additional material such as thermally conductive grease may be interposed between the fin-pairs in order to enhance the conduction of heat between fin-pairs. It is emphasized that, unlike conventional fabricated heat sinks where attachment of the fins to the base may be difficult due to the relatively small cross-sectional area of the fin, heat sinks produced in accordance with the invention have relatively large areas in the base portion 450 of the fin-pairs that may be used to effectuate the fastening. In particular, it is noted that the base portion 450 of each fin-pair provides a relatively large surface area of cL (referring to FIGS. 4 and 5). Such increased surface area greatly enhances thermal conduction from the fin field to the bottom surface of fin-pair 410 and enhances mechanical strength of the fastening means over that provided by conventional heat sink fabrication methods. It is further noted that the dimples 480 themselves may also be formed in such a way as to create an interference fit between a dimple protrusion on one fin-pair and a dimple recess in the adjacent fin-pair, making other forms of fastening means unnecessary, or useful only as an augmentation.

Figure 7:
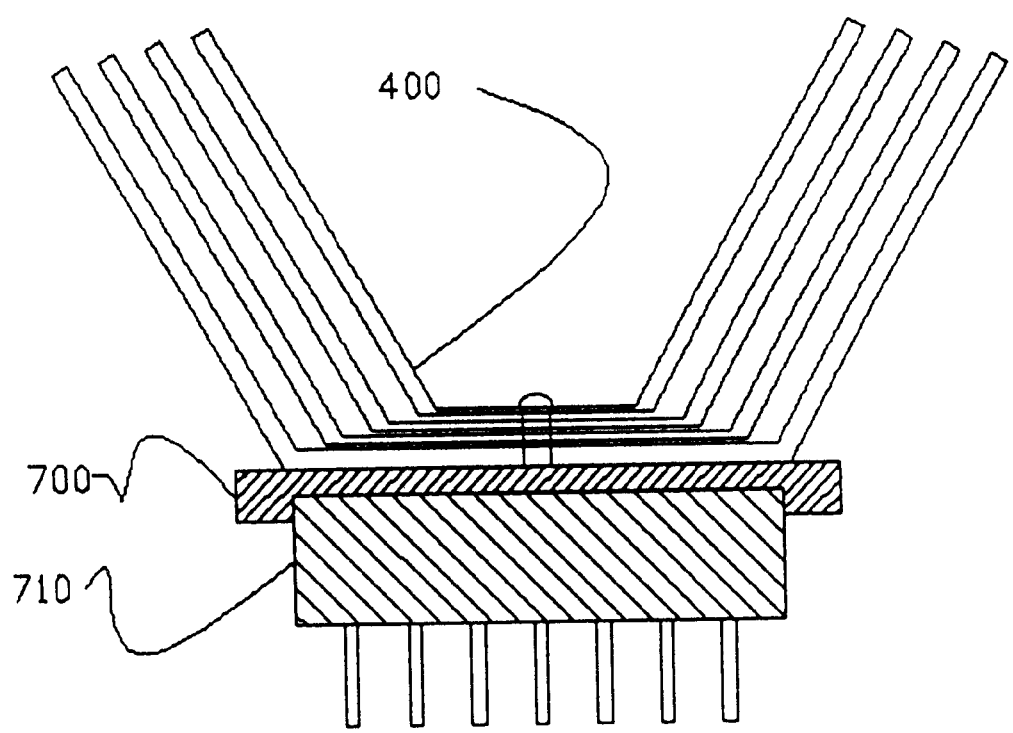
FIG. 7 illustrates a mounting structure that is optionally used as an interface between the het sink of FIG. 4 and a specific heat producing device such as an integrated circuit.

After completion of the fastening step, the heat sink may optionally be subjected to heat treatment or final finishing depending on the requirements of specific applications. The completed heat sink may be used as is, or attached to a mount that is formed for a specific application. For example, as shown in FIG. 7, a mount 700 is disposed between heat sink 400 and a heat-producing device 710, in this case, a typical packaged integrated circuit ("IC"). The bottom portion of mount 700 is adapted to fit the specific dimensions and contours of the IC, while the top portion of the mount is flat to allow fin-pair 410 to be fixed to it.

Figure 8:
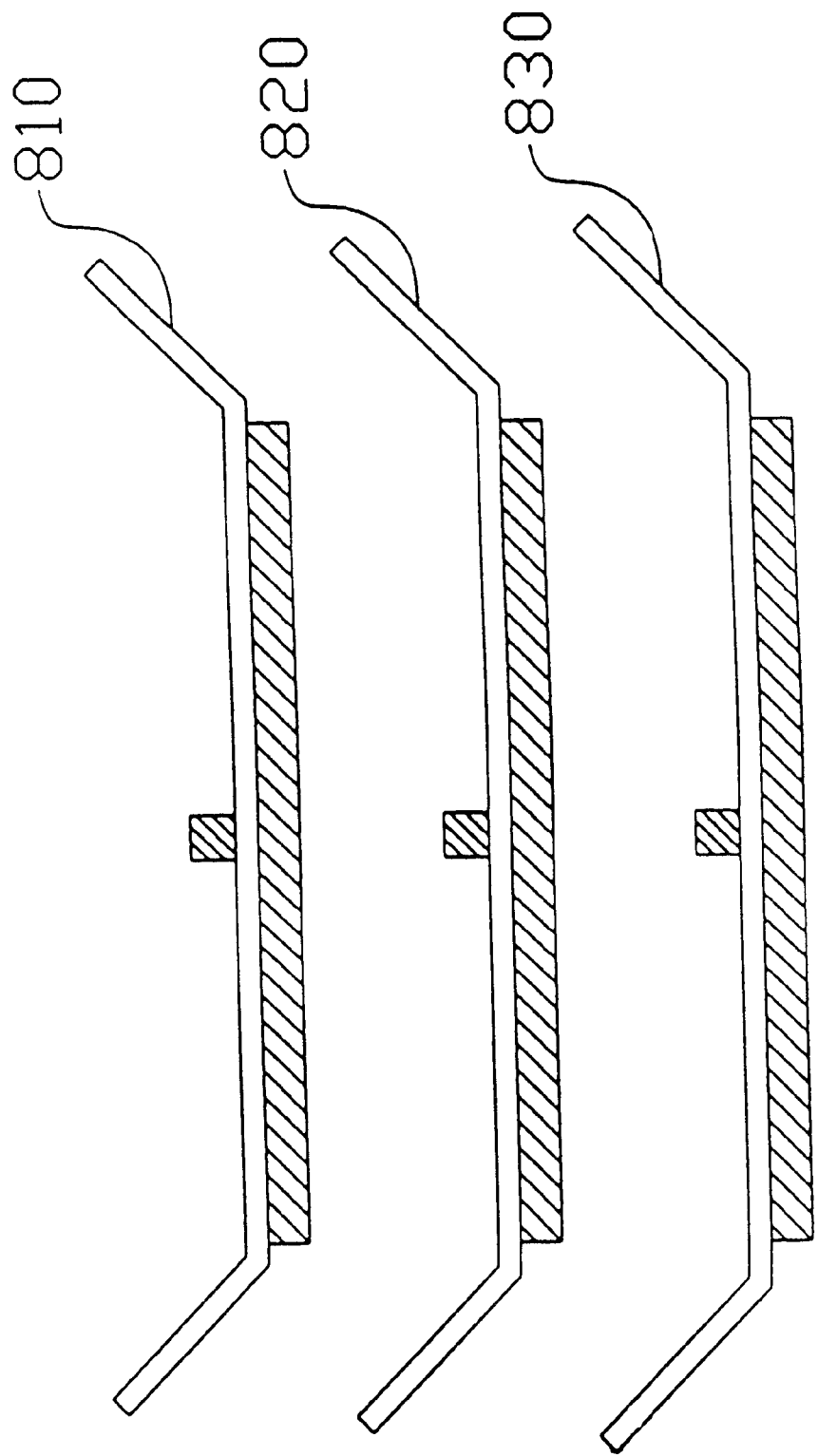
FIGS. 8,8A and 9 illustrate cross-sectional representations of illustrative heat sinks using various fin configurations in accordance with the invention.
Figure 8A:
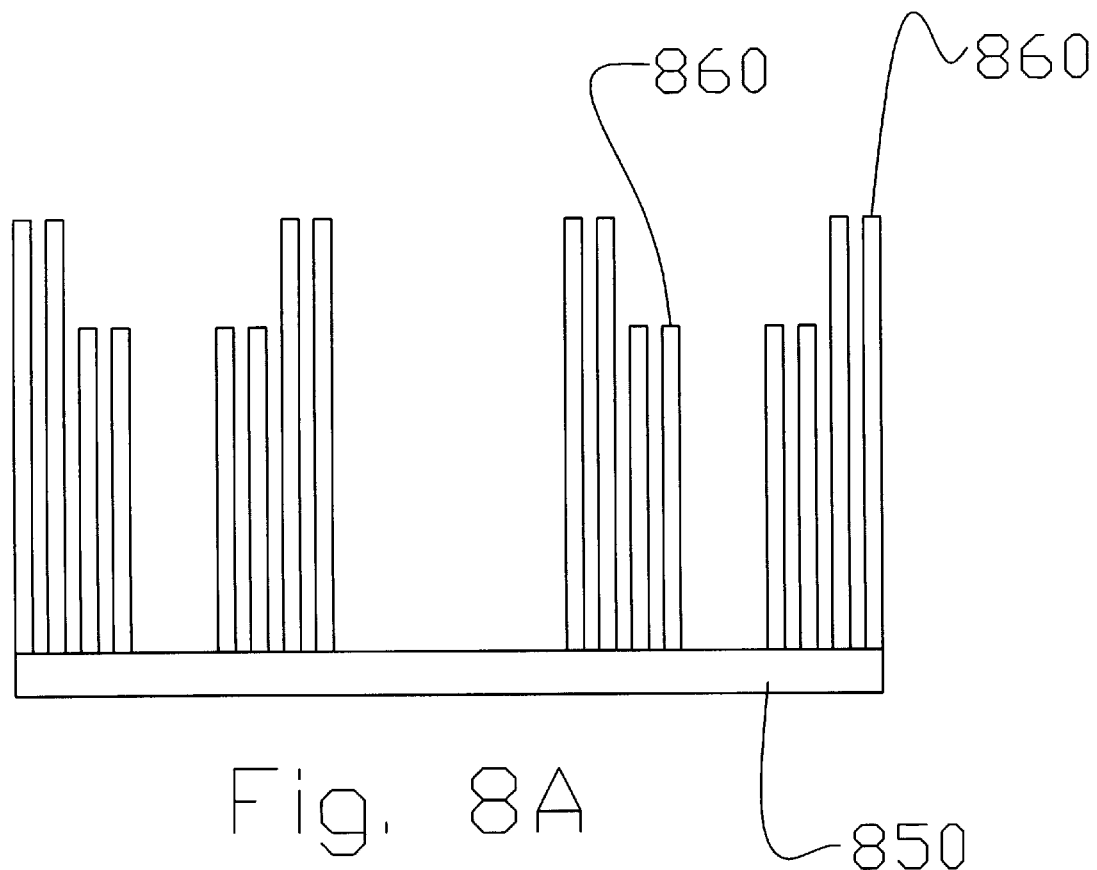

FIG. 8 is a cross-sectional representation of a second illustrative embodiment of a heat sink 800 produced by the inventive method incorporating a brazing technique. In this second embodiment, a series of three fin fields 810, 820 and 830 are arranged in a nested stack with a constant channel width w, with brazing material 812, 822 and 832 respectively, extending from a bottom surface of each adjacent fin. The braze material is mounted on the bottom surface of each fin during the assembly process. The fins 810, 820 and 830 can be held together with screws, mechanical clamping means, arc-welding, or other techniques suitable for holding the fins together. Thereafter the fins are placed inside a brazing furnace for final assembly. In addition, the flanges 860 which form the fin fields may differ in length, as shown in FIG. 8A, and be substantially perpendicular to base 850, or the flanges may extend from the base at an angle, as illustrated in FIG. 8. Accordingly, the brazing method of assembly of the heat dissipating device provides for a variety of fin design formation, including angular or perpendicular assembly of the fin to the base, as well as uniform or non-uniform length of the fins in relation to the remaining fins in the device.

Figure 9:
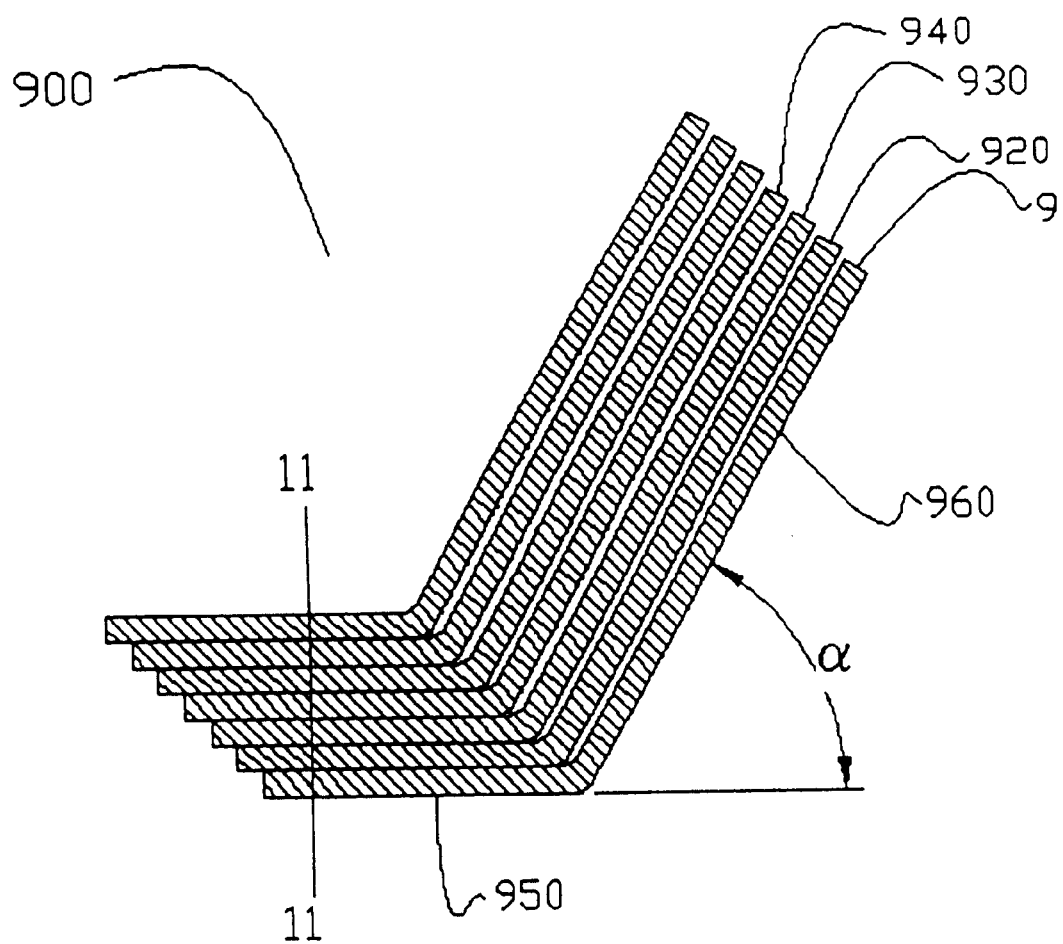
Figure 10:
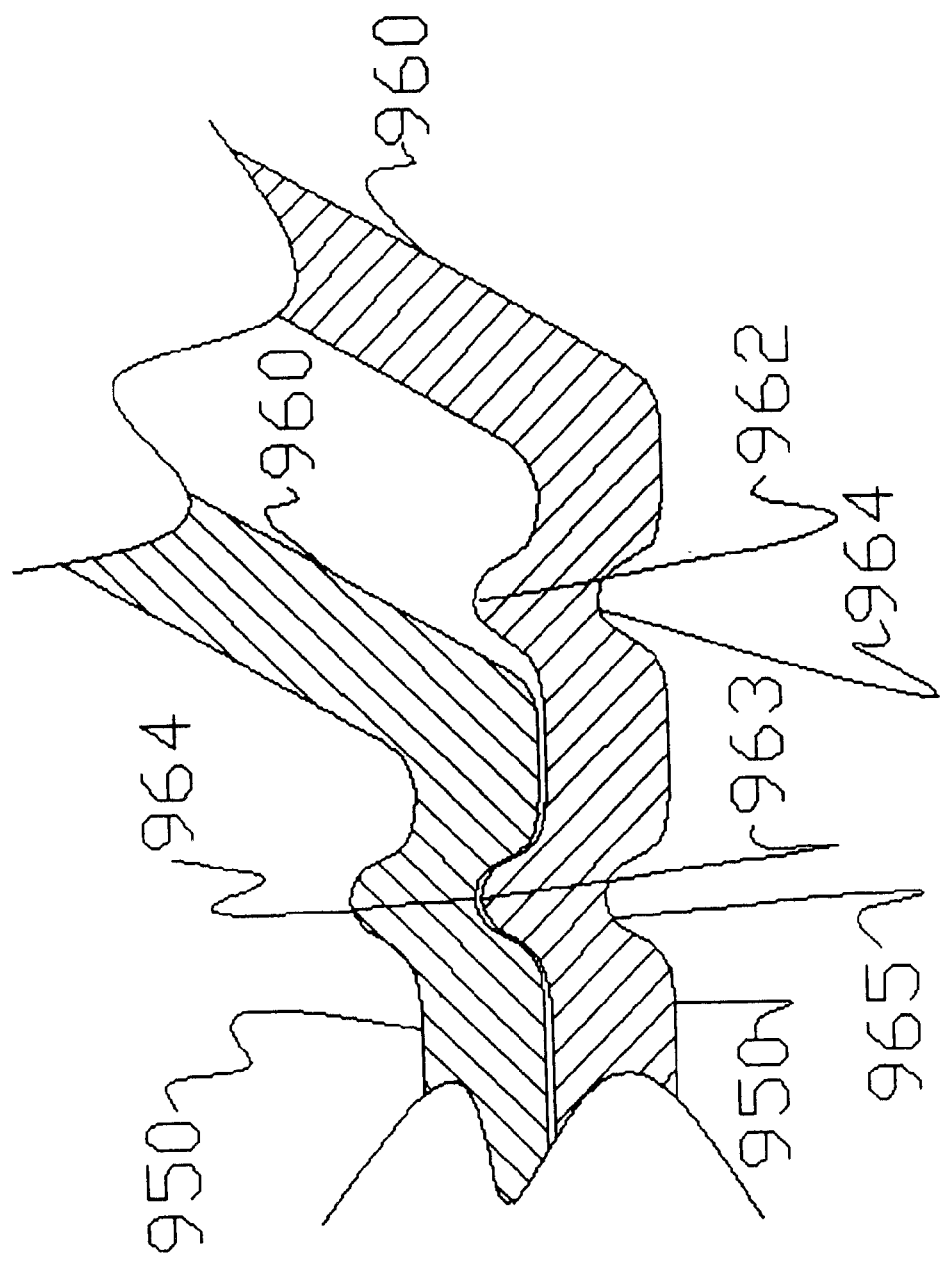
FIG. 10 is an enlarged cross section of the heat sink of FIG. 9 showing the interlocked offset lug feature in accordance with the invention.

FIG. 9 is a cross sectional representation of a third illustrative embodiment of a heat sink produced by the inventive method. In this embodiment, a die is adapted to stamp a formed fin having a base 950 and one flange 960 that extends outward and upward at a steep angle a with respect to the base 950. Unlike die 300 which, as discussed above, is intended to be one of a series of dies for producing a plurality of substantially geometrically similar fins that differ in characteristic width c, the formed fins of this third embodiment are all substantially identical in both geometry and dimension. Thus, only one die configuration is necessary in this embodiment of the invention, as compared to a series of dies required to produce the heat sink shown in FIG. 4. The heat sink of FIG. 9 uses formed fins each having a plurality of dimples which are positioned to interlock, but in an offset manner so as to allow the desired channel spacing w between successive flanges. Referring to FIG. 10, each fin has two semi-spherical protrusions 962 and 963 being proximal and distal to flange 960 in the upper surface of each fin, respectively, and two recesses 964 and 965 being proximal and distal to flange 960 in the bottom surfaces, respectively. As compared to FIG. 6, where a one to one correspondence is maintained between dimple and recess, the dimple arrangement shown in FIG. 10 has an offset correspondence. That is, a dimple protrusion on one fin does not fit into a recess of the corresponding dimple on another fin. Instead, as shown, the distal protrusion on one fin fits into the proximal recess of another fin to maintain the desired channel spacing w.

Figure 11:
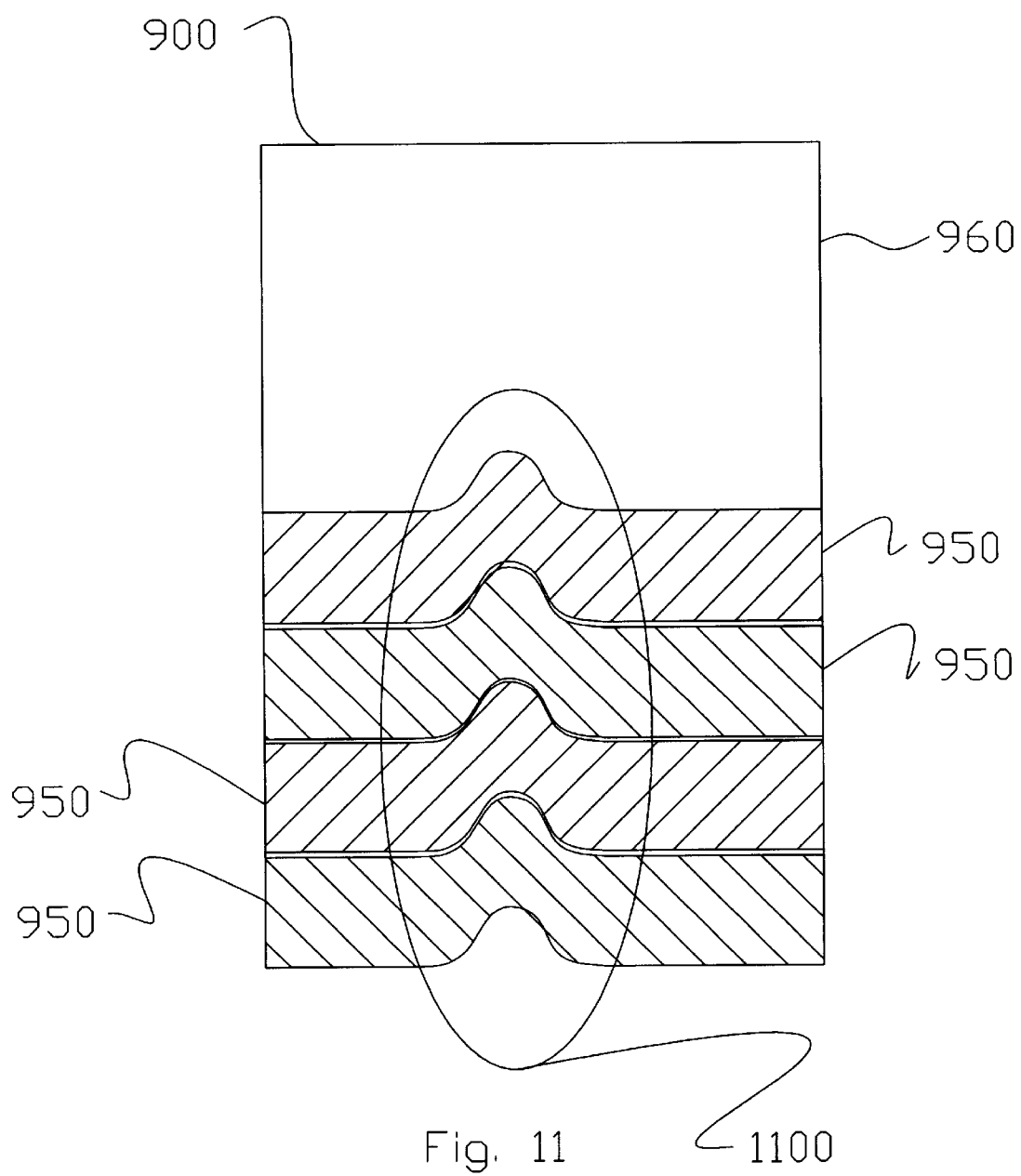
FIG. 11 is an enlarged cross section of the heat sink of FIG. 9, the place of the view being indicated by line 11—11 in FIG. 9 showing the interlocked transverse web feature in accordance with the invention.

FIG. 11 is an enlarged cross section of the heat sink of FIG. 9, the plane of view being indicated by line 11—11 in FIG. 9 showing an interlocked transverse rib feature in accordance with the invention. This feature may be alternatively utilized in place of the interlocked offset dimples shown in FIG. 10. A transverse rib 1100 is located in the base 950 of each fin in heat sink 900. Transverse rib 1100 prevents substantial longitudinal movement of the fins, but allows for variations in transverse location of fins 910–940 with respect to one another. Accordingly, channel width w may be variably selected. In this embodiment, channel spacing may be maintained during the assembly process by tooling such as gauge blocks until completion of the fastening step. Transverse rim 1100 may be adapted to provide an interference fit between adjacent fins as described above.

Figure 12:
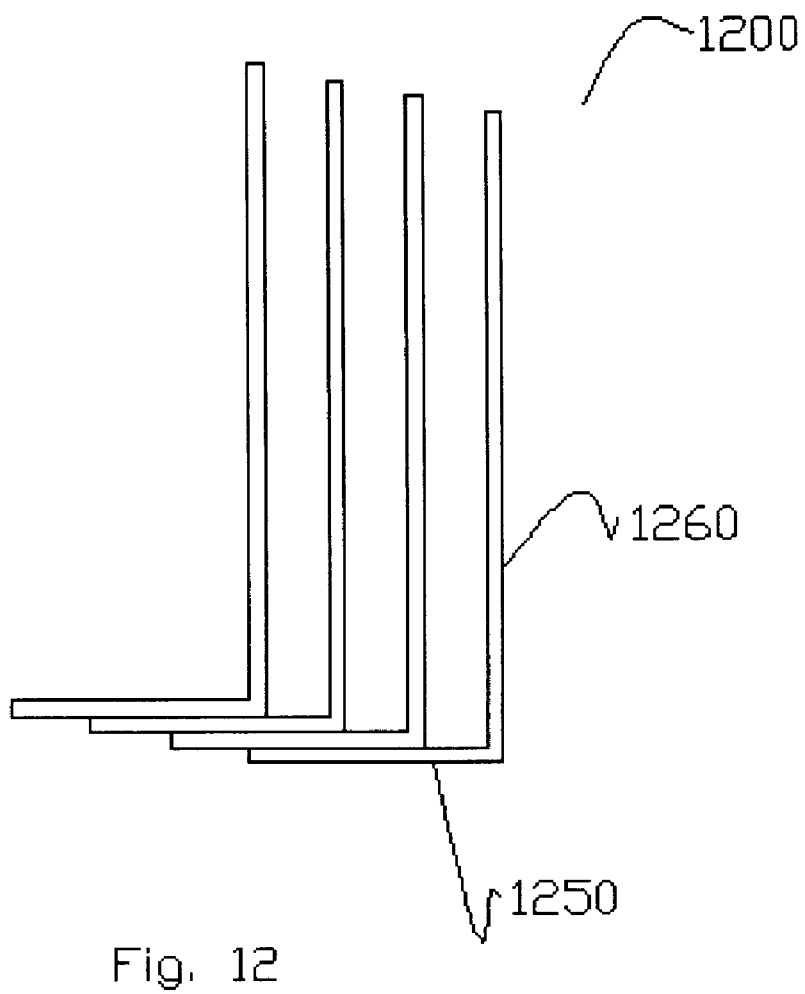
FIG. 12 is an illustration of a cross-sectional representation of a heat sink in accordance with the invention.

FIG. 12 shows a cross-sectional representation of another illustrative heat sink 1200, in accordance with the invention. In this illustrative embodiment of the invention, heat sink 1200 employs a nested stack of fins whereby a single flange 1260 is substantially perpendicular to base 1250.

Figure 13:
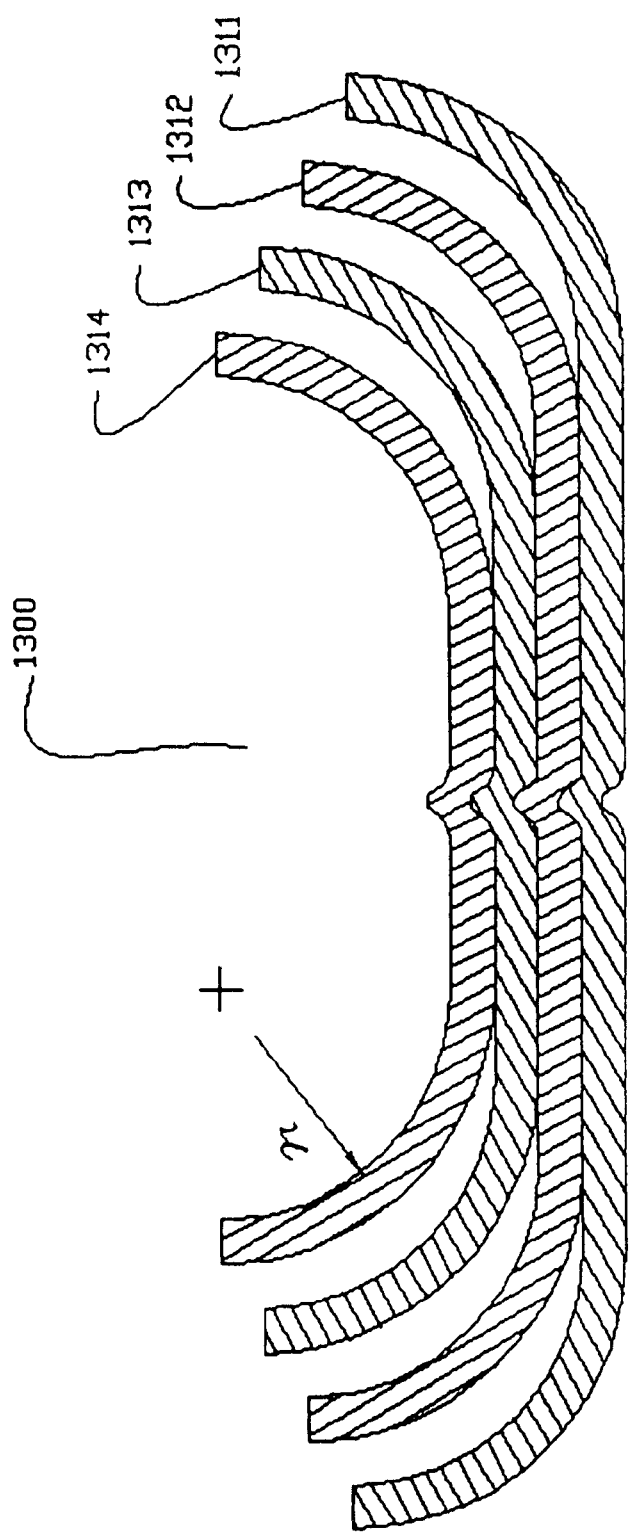
FIG. 13 is a cross-sectional representation of a heat sink in accordance with the invention.

FIG. 13 shows a cross-sectional representation of another illustrative heat sink 1300 in accordance with the invention. In this illustrative embodiment of the invention, heat sink 1300 employs a nested stack of fins whereby fin pairs 1311–1314 have extended flanges comprising a curved profile structure. Accordingly, each curved flange has a radius r.

In each of the illustrations provided, the method of manufacturing the heat dissipating device provides the option of securing the adjacent fins to form the base of the heat dissipating device from the common horizontal portions of the fins, or for securing the adjacent fins to form a heat dissipating device and consequently securing the stack of fins to a secondary base. Accordingly, the novel method of forming a heat dissipating device provides alternative method of forming the base portion of the device depending upon the requirements of the system and ultimately the heat dissipating device.

The above description is of a novel method for fabricating a heat dissipating device. Although the present invention has been described in connection with preferred embodiments thereof, it will be appreciated by those skilled in the art that additions, deletions, modifications, and substitutions not specifically described may be made without departing from the spirit and scope of the invention as defined in the appended claims and the scope should not be limited to the dimensions indicated herein above.

The invention claimed is:

1. A method for manufacturing a heat dissipation device, comprising:
   forming a plurality of fins from a stock of thermally conductive material, said fins having an adjacent horizontal portion wherein said horizontal portion forms a base;
   stacking said horizontal portion of adjacent fins to form a fin field structure whereby a side plate fin comprises a horizontal portion equivalent to the length of the base and each adjacent horizontal portion has a differing length so that said base has a thickness decreasing progressively along said base length.

2. The method for manufacturing a heat dissipation device as claimed in claim 1, further comprising forming a positioning element in the horizontal portion of said fin in the form of an indentation extending in a vertical direction forming a projection from a top surface of said horizontal portion of said fin and forming a corresponding recess in a bottom surface of said horizontal portion of said fin.

3. The method for manufacturing a heat dissipation device as claimed in claim 2, wherein said horizontal portions forming the base of said device.

4. The method for manufacturing a heat dissipation device as claimed in claim 2, wherein said vertical projection defines a channel width between adjacent fins.

5. The method for manufacturing a heat dissipation device as claimed in claim 4, further comprising forming predefined gaps between adjacent vertical flanges for forming channels of a fin field of the device.

6. The method for manufacturing a heat dissipation device as claimed in claim 3, further comprising fastening said stack of fins for forming the device.

7. The method for manufacturing a heat dissipation device as claimed in claim 6, further comprising attaching the heat dissipation device to a secondary base.

8. The method for manufacturing a heat dissipation device as claimed in claim 7, wherein said attaching step is a bonding technique selected from the group consisting of soldering, welding, brazing, gluing, pressing, and heating, and combinations thereof.

9. The method for manufacturing a heat dissipation device as claimed in claim 1, wherein adjacent fins are geometrically similar.

10. The method for manufacturing a heat dissipation device as claimed in claim 1, wherein adjacent fins are geometrically dissimilar.

11. The method for manufacturing a heat dissipation device as claimed in claim 1, further comprising forming surface enhancements within said fins for disrupting the boundary layer along said plate fins causing a reduction in high pressure within said fin field.

12. The method for manufacturing a heat dissipation device as claimed in claim 11, wherein said surface enhancements are selected from the group consisting of vents, vanes, textured surfaces, and combinations thereof.

13. The method for manufacturing a heat dissipation device as claimed in claim 2, further comprising horizontally mounting multiple fin field structures to form a larger heat dissipation device.

14. The method for manufacturing a heat dissipation device as claimed in claim 13, further comprising mounting said larger heat dissipation device to a secondary base.

15. The method for manufacturing a heat dissipation device as claimed in claim 2, further comprising assembling said fins into a nested stack whereby each of said positioning elements is received by a positioning element of an adjacent fin, and said positioning elements holding a stack of fins in a vertical relationship.

* * * * *